United States Patent
Lee et al.

(10) Patent No.: US 8,742,408 B2
(45) Date of Patent: Jun. 3, 2014

(54) ORGANIC LIGHT EMITTING DIODE DISPLAY AND MANUFACTURING METHOD THEREOF

(71) Applicant: LG Display Co., Ltd., Seoul (KR)

(72) Inventors: Jae Young Lee, Daejeon (KR); Hee Chul Lim, Incheon (KR); Hyun Tae Byun, Incheon (KR); Byoung Chul Kim, Gunsan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/685,190

(22) Filed: Nov. 26, 2012

(65) Prior Publication Data

US 2013/0161592 A1  Jun. 27, 2013

(30) Foreign Application Priority Data

Dec. 22, 2011 (KR) ........................ 10-2011-0140606

(51) Int. Cl.
*H01L 51/00* (2006.01)
(52) U.S. Cl.
USPC ........................ 257/40; 438/99; 257/E51.022
(58) Field of Classification Search
USPC ......... 257/40, 72, E51.018, E51.022; 438/82, 438/99
See application file for complete search history.

(56) References Cited

U.S. PATENT DOCUMENTS

| 8,174,179 | B2 | 5/2012 | Suh |
| 8,222,636 | B2 * | 7/2012 | Fujii ........................ 257/40 |
| 8,471,446 | B2 | 6/2013 | Eom et al. |
| 8,481,997 | B2 | 7/2013 | Kim et al. |

FOREIGN PATENT DOCUMENTS

| KR | 10-0565742 B1 | 3/2006 |
| KR | 10-2010-0007265 A | 1/2010 |
| KR | 10-2011-00857778 A | 7/2011 |
| KR | 10-2011-0108897 A | 10/2011 |

* cited by examiner

*Primary Examiner* — Quoc Hoang
(74) *Attorney, Agent, or Firm* — Birch, Stewart, Kolasch & Birch, LLP

(57) ABSTRACT

An OLED device is discussed which includes: a drive thin film transistor formed on a substrate; an organic light emitting diode configured with first electrode, a light emission layer and a second electrode which are sequentially formed on the substrate provided with the drive thin film transistor; a barrier film disposed on the substrate with the organic light emitting element and configure to include a retardation film, an optically isotropic film and a thin layer interposed between the retardation film and the optically isotropic film; and a polarizing plate disposed on the barrier film and configured to prevent reflection of external light.

18 Claims, 6 Drawing Sheets

ORGANIC LIGHT EMITTING DIODE DISPLAY AND MANUFACTURING METHOD THEREOF

The present application claims priority under 35 U.S.C. §119(a) of Korean Patent Application No. 10-2011-0140606 filed on Dec. 22, 2011, which is hereby incorporated by reference in its entirety.

BACKGROUND

1. Field of the Disclosure

The present application relates to an organic light emitting diode display, and more particularly to an organic light emitting diode display and a manufacturing method thereof that are adapted to enhance reliability by shielding it from external moisture and oxygen.

2. Description of the Related Art

Image display devices used for displaying a variety of information on a screen are one of the core technologies of the information and communication era. Such image display devices have been being developed to be thinner, lighter, and more portable, and furthermore to have a high performance. Actually, flat panel display devices are spotlighted in the display field due to their reduced weight and volume, well known disadvantages of cathode ray tubes (CRTs). The flat panel display devices include OLED (organic light-emitting display) devices which display images by controlling the light emitting quantity of an organic light emission layer. The OLED devices are self-illuminating display devices employing a thin light emission layer between electrodes. As such, the OLED devices can become thinner like a paper.

An ordinary OLED device is configured with a sub-pixel driver array and an organic light emitting element array which are formed on a substrate. The ordinary OLED device displays images by enabling light to be emitted from organic light emitting elements of the organic light emitting element array and to pass through the substrate or a barrier layer.

The organic light emitting element is easy to deteriorate due to internal and external factors. The internal factors include deterioration of the electrodes and the light emission layer caused by oxygen and deterioration of the light emission layer caused by interfacial reactions. The external factors include external moisture and oxygen, ultraviolet rays, manufacturing condition of the organic light emitting element and so on. Particularly, external oxygen and moisture greatly affect the lifespan of the organic light emitting element. As such, it is very important to package the organic light emitting element.

As a packaging method, a process of sealing a substrate, on which with the organic light emitting element is formed, using a protective cap is being used. In order to remove moisture within the protective cap, a moisture absorbent is attached to at a central portion the inside surface of the protective cap prior to sealing the substrate. Also, a semi-permeable film allowing for moisture and oxygen to come in and out must be attached to the inner surface of the protective cap, in order to prevent the fall of the moisture absorbent on an organic material layer of the organic light emitting element.

Such a packaging method allows the organic material layer of the organic light emitting element to be packaged with the protective cap, which is formed form glass or a metal, and protected from oxygen and moisture. However, the packaging method can increase manufacturing costs because of using additional material such as an adhesive and a moisture absorbent. Also, the protective cap can increase the volume and thickness of the OLED device. Moreover, it is difficult for a flexible OLED device to apply the packaging method, because the protective cap is formed from glass or a metal.

To address this matter, an encapsulation method has been proposed as a different method for packaging the OLED device. The encapsulation method forms a thin barrier layer on a substrate provided with the organic light emitting element, in order to package the OLED device. The barrier layer is formed to include either an inorganic film or the inorganic film and a polymer film stacked thereon.

However, the inorganic film requires a high deposition temperature and has an inferior coverage and a low density. Due to this, it is difficult to use the inorganic film as a protective film of the organic light emitting element.

BRIEF SUMMARY

Accordingly, embodiments of the present application are directed to an OLED device and a manufacturing method thereof that substantially obviate one or more of problems due to the limitations and disadvantages of the related art, and a method of manufacturing the same.

The embodiments are to provide an OLED device and a manufacturing method thereof that are adapted to allow flexibility and enhance reliability by shielding external moisture and oxygen and protecting organic light emitting elements using a barrier film which is coated with an organic or inorganic thin film.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect of the present embodiment, an OLED device includes: a drive thin film transistor formed on a substrate; an organic light emitting diode configured with first electrode, a light emission layer and a second electrode which are sequentially formed on the substrate provided with the drive thin film transistor; a barrier film disposed on the substrate with the organic light emitting element and configure to include a retardation film, an optically isotropic film and a thin layer interposed between the retardation film and the optically isotropic film; and a polarizing plate disposed on the barrier film and configured to prevent reflection of external light.

A manufacturing method of the OLED device according to a first general aspect of the present embodiment includes: forming a drive thin film transistor on a substrate; forming an organic light emitting diode configured a first electrode, a light emission layer and a second electrode which are sequentially formed on the substrate provided with the drive thin film transistor; attaching a barrier film, which includes a retardation film, an optically isotropic film and a thin layer interposed between the retardation film and the optically isotropic film, to the substrate provided with the organic light emitting element; and attaching a polarizing plate, which is configured to prevent reflection of external light, on the barrier film.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
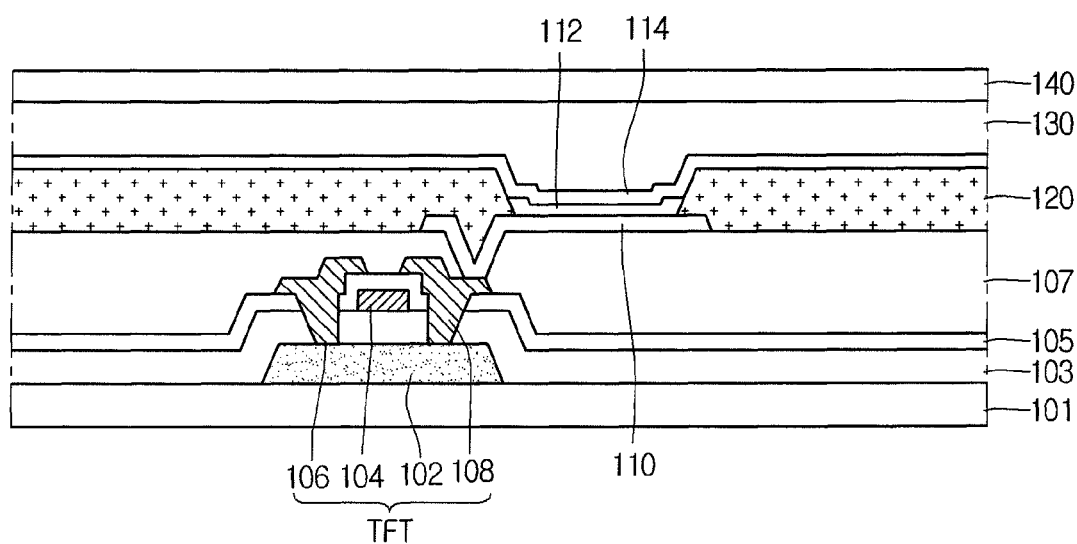
FIG. 1 is a cross-sectional view showing an OLED device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a cross-sectional view showing an organic light emitting diode display according to an embodiment of the present disclosure.

As shown in FIG. 1, the OLED device according to an embodiment of the present disclosure includes a substrate 101 on which a thin film transistor TFT and an organic light emitting element. Also, the OLED device includes a barrier film 130 attached to the substrate 101 which is provided with the thin film transistor TFT and the organic light emitting element. Further, the OLED device includes a polarizing film 140 attached to the barrier film 130.

If the drive thin film transistor TFT is a top gate thin film transistor, a semiconductor layer 102, a gate insulation film 103, a gate electrode 104, an interlayer insulation film 105, source and drain electrode 106 and 108, and a passivation layer 107 are sequentially formed on the substrate 101.

The semiconductor layer 102 can be formed from poly-silicon. In this case, a dopant can be doped into a part of the semiconductor layer 102. Alternatively, the semiconductor layer 102 can be formed from amorphous silicon, or one among a variety of organic semiconductor materials such as pentacene and so on.

When the semiconductor layer 102 is formed from poly-silicon, the poly-silicon layer can be prepared by forming an amorphous silicon layer and crystallizing the amorphous silicon layer. The crystallization of amorphous silicon can be performed using one of RTA (Rapid Thermal Annealing), MILC (Metal Induced Lateral Crystallization), an SLS (Sequential Lateral Solidification) processes and so on.

The gate insulation film 103 can be formed from an inorganic insulation material such as silicon oxide, silicon nitride or others. Alternatively, the gate insulation film 103 can be formed from an organic insulation material.

The gate electrode 104 can be formed from one among a variety of conductive materials. For example, the gate electrode 104 can be formed from at least one selected from a material group which consists of magnesium Mg, aluminum Al, nickel Ni, chromium Cr, molybdenum Mo, gold Au and alloys thereof including MoW.

The interlayer insulation film 105 can be formed from an inorganic insulation material such as silicon oxide, silicon nitride or others. Alternatively, the interlayer insulation film 105 can be formed from an organic insulation material. The interlayer insulation film 105 and the gate insulation film 103 can be selectively or partially removed, in order to form contact holes exposing source and drain regions of the semiconductor layer 102.

The source and drain electrodes 106 and 108 can be formed from the same material as the gate electrode 104. Also, the source and drain electrodes 106 and 108 can be prepared by forming a conductive film on the interlayer insulation film 105 in such a manner as to fill the contact holes and patterning the conductive film. Moreover, the source and drain electrodes 104 and 106 can be formed in a single layer structure or a multiple layered structure.

The passivation layer 107 protects the drive thin film transistor TFT and provides a planar surface. The passivation layer 107 can be formed from one among a variety of materials. For example, the passivation layer 107 can be formed from an organic material such as BCB (benzocyclobutene), acryl or others. Alternatively, the passivation layer 107 can be formed from an inorganic material such as a silicon nitride SiNx. Also, the passivation layer 107 can be formed in a variety of structures. Actually, the passivation layer can be formed in a single layer structure or a multiple layered structure with at least two stacked layers.

The organic light emitting element includes a first electrode 110 disposed on the passivation layer 107, an organic light emission layer 112 disposed on the first electrode and configured to include a light emission layer, and a second electrode 114 disposed on the organic light emission layer 112.

The organic light emission layer 112 can configured with at least one hole support layer, the light emission layer and at least one electron support layer which are sequentially stacked on the first electrode 110. Alternately, at least one hole support layer, the light emission layer and the at least one electron support layer can be stacked on the first electrode in reverse order.

The first electrode 110 is electrically connected to the drain electrode 108 of the drive thin film transistor TFT via a contact hole. Such a first electrode 110 can be formed from an opaque conductive material with a high reflectance. The opaque conductive material can include aluminum Al or others.

A bank insulation film 120 is formed on the rest region with the exception of a light emission region. As such, the bank insulation film 120 can be formed to have a bank opening which exposes the first electrode 110 opposite to the light emission region.

The second 114 is formed on the organic light emission layer 112. Also, the second electrode 114 can be formed from a transparent conductive material such as indium-tin-oxide ITO, indium-zinc-oxide IZO, indium-tin-zinc-oxide ITZO or others. As such, light emitted from the organic light emission layer 112 can be output in an upward direction of the second electrode 114.

The barrier film 130 is attached to the surface of the substrate 101 provided with the organic light emitting element, in order to protect the organic light emitting element. The barrier film 130 is not formed directly on the substrate 101 provided with the organic light emitting element. In other words, the barrier film 130 is prepared in such a manner as to be separated from the substrate 101, and is attached to the surface of the substrate 101 provided with the organic light emitting element by means of an adhesive material.

The barrier film 130 shields the intrusion of moisture and/or oxygen into the organic light emitting element. To this end, the barrier film 120 can have one of structures shown in FIGS. 3 through 10. Such a barrier film 130 will be described in detail referring to FIGS. 3 through 10 later.

The polarizing plate 140 can be a linear polarizing plate. The linear polarizing plate transmits light generated in the organic light emission layer 112, but shields external light reflected by the first electrode 110 which is formed from an opaque material. As such, the linear polarizing plate can enhance contrast of the OLED device.

Figure 2:
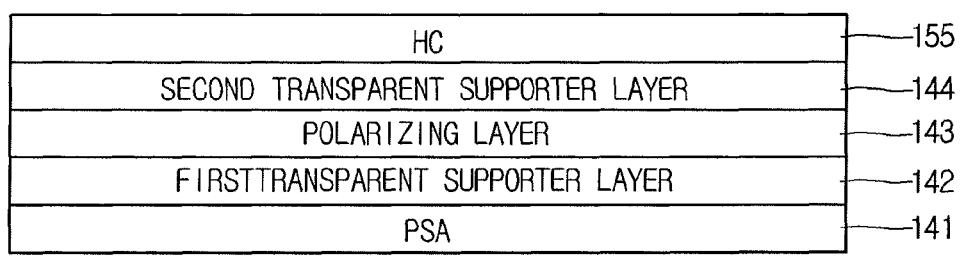
FIG. 2 is a detailed cross-sectional view showing in detail a polarizing plate in FIG. 1.

Such a polarizing plate 140 includes a polarizing layer 143 configured to polarize incident light, first and second transparent supporter layers 142 and 143 formed on both surface of the polarizing layer 143 and configured to protect the polarizing layer 143, as shown in FIG. 2. Also, the polarizing plate 140 includes a pressure sensitive adhesive (PSA) layer 141 attached to the lower surface of the first transparent supporter layer 142, and a protective layer, hereinafter "hard coating (HC) layer", 145 formed on the upper surface of the second transparent supporter layer 144.

The polarizing layer 143 can be prepared by absorbing halogen salt crystals, such as iodine crystals, into a poly-vinyl alcohol (PVA) film and expanding the PVA film, into which the halogen salt crystals are absorbed, in a fixed direction. The halogen salt crystals within the PVA film are aligned side by side in the expanding direction, i.e., the fixed direction.

The halogen salt crystals absorb light being entered along a first direction, but transmit light being entered along a second direction perpendicular to the first direction. In accordance therewith, the polarizing layer 143 can provide a polarization function.

The first and second transparent supporter layers 142 and 144 are used to support and protect the polarizing layer 143. As such, the first and second transparent supporter layers 142 and 144 must be formed from a transparent material which has superior heat resistance and high mechanical strength without any birefringence. In other words, the first and second transparent supporter layers 142 and 144 must have suitable properties for physically supporting and protecting the polarizing layer 143. Also, the first and second transparent supporter layers 142 and 144 must have a property of being superiorly adhered to an adhesive material or a cohesive material because of their wide areas. In view of these points, the first and second transparent supporter layers 142 and 144 can be formed from at least one selected from the group of acetate based resin such triacetylcellulose (TAC), polyester based resin, polyimide based resin, polyolefin based resin, acryl based resin, polynorbornene based resin and so on.

Under the consideration of a polarization characteristic and endurability, it is preferable to use a TAC film as first and second transparent supporter layers 142 and 144. The TAC film can be soaped with an alkali or others before it is used as first and second transparent supporter layers.

Such a polarizing plate 140 with the above-mentioned structure polarizes external light being entered from the exterior and shields external light reflected by the first electrode 110.

FIGS. 3 through 10 are cross-sectional views showing first through eighth embodiments of the barrier films shown of FIG. 1.

Figure 3:
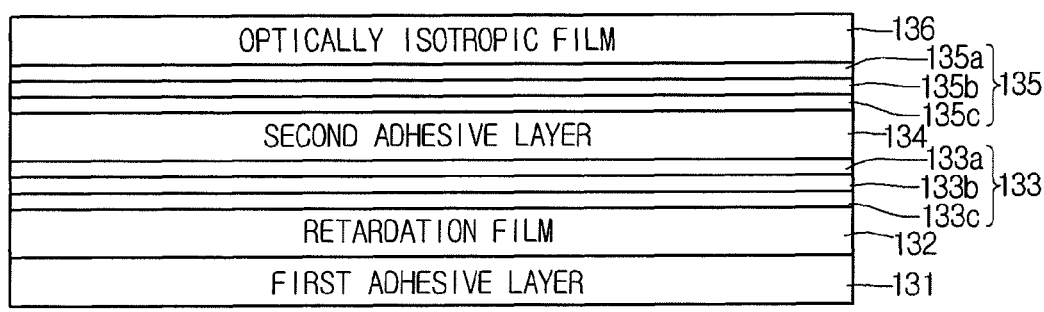
FIGS. 3 through 10 are cross-sectional views showing first through eighth embodiments of the barrier film shown of FIG. 1.

As shown in FIGS. 1 and 3, the barrier film 130 according to a first embodiment of the present disclosure includes a retardation film 132, first and second thin layers 133 and 135 and an optically isotropic film 136. Also, the barrier film 130 includes a first adhesive layer 131 formed on the lower surface of the retardation film 132, and a second adhesive layer 134 formed between the first and second thin films 133 and 135.

The first adhesive layer 131 can be formed from one of a thermosetting epoxy-based adhesive material and a room temperature curing epoxy-based adhesive material. The first adhesive layer 131 is used to adhere the barrier film 130 to the substrate 101 provided with the organic light emitting element.

The retardation film 132 has a central axis inclined at an angle of 45 with respect to a central axis of the polarizing plate (140 in FIG. 1), and retards the phase of light entered the barrier film by $\lambda/4$. To this end, the retardation film 132 can be formed from a polycarbonate based material and have a retardation range of about 138~148 nm.

The first thin layer 133 is disposed on the retardation film 132. The first thin layer 133 can include first and second organic film 133a and 133c and a first inorganic film 133b interposed between the first and second organic films 133a and 133c.

The first and second organic films 133a and 133c can be formed from polymer materials including at least one selected from the group of acryl based resin, epoxy based resin, polyimide, polyethylene and so on. Such first and second organic films 133a and 133c are used to prevent the intrusion of external moisture and/or oxygen. Also, the first and second organic films 133a and 133c can alleviate interlayer stresses which are caused between the other layers by bending of the OLED device.

The first inorganic film 133b can be formed from one of aluminum oxide $Al_xO_y$, silicon oxide $SiO_x$ and silicon nitride $SiN_x$. Such a first inorganic film 133b can prevent the intrusion of external moisture and/or oxygen which have passed through the first organic film 133a.

In the same as the first thin layer 133, the second thin layer 135 can be configured with third and fourth organic films 135a and 135c and a second inorganic film 135b interposed between the third and fourth organic films 135a and 135c.

The second adhesive layer 134 can be formed from the same material as the first adhesive layer 131. The second adhesive layer 134 is interposed between the first and second thin layers 133 and 135 and used to fasten the first and second thin layers 133 and 135.

The optically isotropic film 136 is formed to have an optically isotropic property. As such, the optically isotropic film 136 allows incident light to pass through it in the original state without being retarded. In detail, the optically isotropic film 136 can be formed to have a retardation range of about 0~5 nm, in order to secure the optically isotropic property.

To this end, the optically isotropic film 136 can be formed from either one of a cyclic-olefin-copolymer (COC) based material and a cyclic-olefin-polymer (COP) based material, or a mixture of glass fiber and at least one of a COC based material and a COP based material.

If glass fiber is included, the optically isotropic film 136 has a thermal expansion coefficient similar to that of the substrate 101 on which the organic light emitting element is formed. As such, the optically isotropic film 136 can prevent a twist of the OLED device which can be caused by the difference of thermal expansion coefficients.

The second thin layer 135 configured with the third and fourth organic films 135a and 135c and the second inorganic film 135b interposed between the third and fourth organic films 135a and 135c can primarily prevent the intrusion of external moisture and/or oxygen into the organic light emitting element.

Also, the first thin layer 133 configured with the first and second organic films 133a and 133c and the first inorganic film 133b interposed between the first and second organic films 133a and 133c can secondarily prevent the intrusion of external moisture and/or oxygen which have passed through the second thin layer 135.

In this manner, the barrier film 130 including the first and second thin layer 133 and 135 can encompass the organic light emitting element and prevent the intrusion of external moisture and/or oxygen into the organic light emitting element. Therefore, the organic light emitting element can be stably protected.

Figure 4:
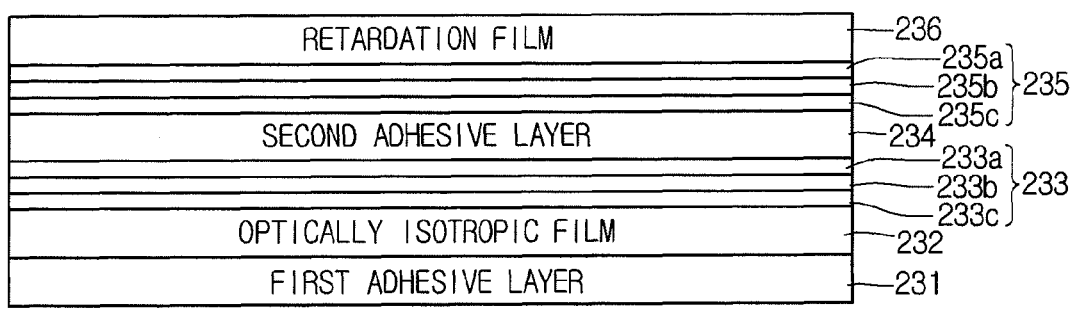

Referring to FIG. 4, a barrier film 230 according to a second embodiment of the present disclosure includes a first adhesive layer 231, an optically isotropic film 232, a first thin layer 233, a second adhesive layer 234, a second thin layer 235 and a retardation film 236 which are sequentially stacked.

The barrier film 230 of the second embodiment has the same structure as that of the first embodiment, except that the optically isotropic film 232 is disposed on the first adhesive layer 231 and the retardation film 236 is disposed on the second thin layer 235.

In the barrier film 230 according to a second embodiment of the present disclosure, the first thin layer 233 can be configured with first and second organic films 233a and 233c and a first inorganic film 233b interposed between the first and second organic films 233a and 233c. Similarly, the second thin layer 235 can be configured with third and fourth organic films 235a and 235c and a second inorganic film 235b interposed between the third and fourth organic films 235a and 235c.

Since the first and second thin layer 233 and 235 with a multi-layered structure of the organic and inorganic films are included, the barrier film 230 according to a second embodiment of the present disclosure can encompass the organic light emitting element and prevent the intrusion of external moisture and/or oxygen into the organic light emitting element. Therefore, the organic light emitting element can be stably protected.

Figure 5:
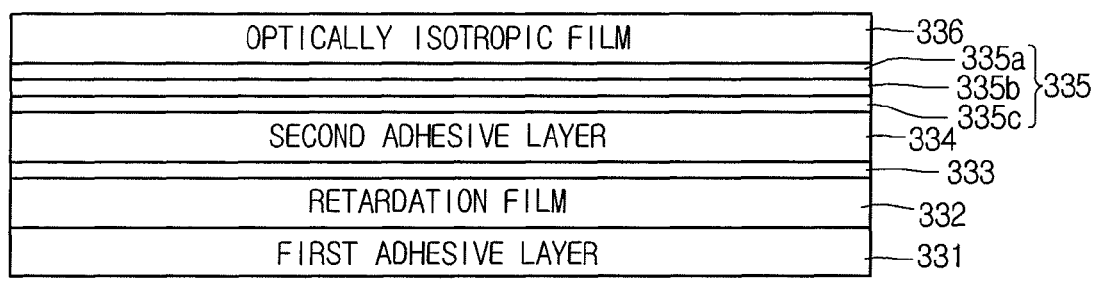

As shown in FIG. 5, a barrier film 330 according to a third embodiment of the present disclosure includes a first adhesive layer 331, an optically isotropic film 332, an organic layer 333, a second adhesive layer 334, a thin layer 335 and a retardation film 336 which are sequentially stacked.

In the barrier film 330 according to a third embodiment of the present disclosure, the thin layer 335 can be configured with first and second organic films 335a and 335c and an inorganic film 335b interposed between the first and second organic films 235a and 235c. The organic layer 333 can be formed from the same material as the first and second organic films 335a and 335c. Also, the organic layer 333 is disposed on the optically isotropic film 332.

The thin layer 335 can be used to primarily prevent the intrusion of external moisture and/or oxygen into the organic light emitting element. The organic layer 333 can be used to secondarily prevent the intrusion of external moisture and/or oxygen which have passed through the thin layer 335.

Such a barrier film 330 according to a third embodiment of the present disclosure, which includes the organic layer 333 and the thin layer 335 with a multi-layered structure of the organic and inorganic films, can encompass the organic light emitting element and prevent the intrusion of external moisture and/or oxygen into the organic light emitting element. Therefore, the organic light emitting element can be stably protected, and furthermore reliability of the organic light emitting element can be enhanced.

Figure 6:
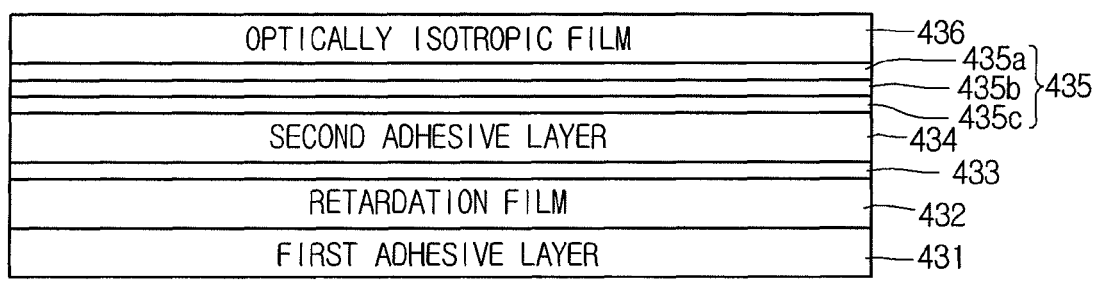

Referring to FIG. 6, a barrier film 430 according to a fourth embodiment of the present disclosure includes a first adhesive layer 431, a retardation film 432, an organic layer 433, a second adhesive layer 434, a thin layer 435 and an optically isotropic film 436 which are sequentially stacked.

The barrier film 430 of the fourth embodiment has the same structure as that of the third embodiment, except that the retardation film 432 is disposed on the first adhesive layer 431 and the optically isotropic film 436 is disposed on the thin layer 435.

Figure 7:
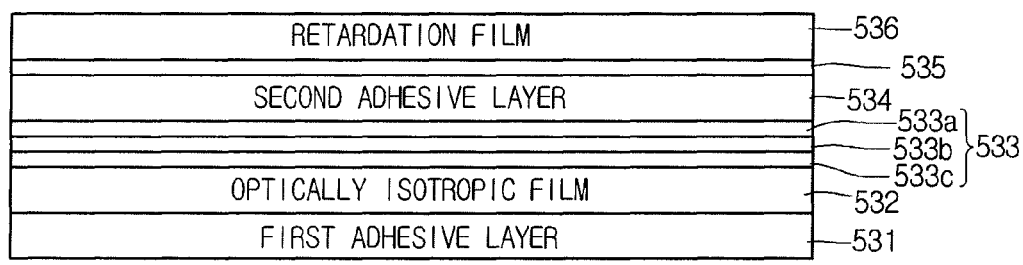

As shown in FIG. 7, a barrier film 530 according to a fifth embodiment of the present disclosure includes a first adhesive layer 531, an optically isotropic film 532, a thin layer 533, a second adhesive layer 534, an organic layer 535 and a retardation film 536 which are sequentially stacked.

The thin layer 533 can be configured with first and second organic films 533a and 533c and an inorganic film 533b interposed between the first and second organic films 533a and 533c. The organic layer 535 can be formed from the same material as the first and second organic films 533a and 533c.

The organic layer 535 can be used to primarily prevent the intrusion of external moisture and/or oxygen into the organic light emitting element. The thin layer 533 can be used to secondarily prevent the intrusion of external moisture and/or oxygen which have passed through the organic layer 535.

In this manner, the barrier film 530 according to a fifth embodiment of the present disclosure includes the organic layer 535 and the thin layer 533 with a multi-layered structure of the organic and inorganic films. As such, the barrier film 530 can encompass the organic light emitting element and prevent the intrusion of external moisture and/or oxygen into the organic light emitting element. Therefore, the organic light emitting element can be stably protected, and furthermore reliability of the organic light emitting element can be enhanced.

Figure 8:
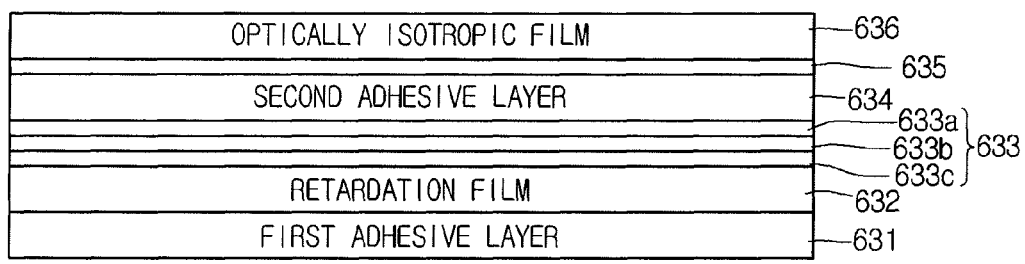

Referring to FIG. 8, a barrier film 630 according to a sixth embodiment of the present disclosure includes a first adhesive layer 631, a retardation film 632, a thin layer 633, a second adhesive layer 634, an organic layer 635 and an optically isotropic film 636 which are sequentially stacked.

The barrier film 630 of the sixth embodiment has the same structure as that of the fifth embodiment, except that the retardation film 632 is disposed on the first adhesive layer 631 and the optically isotropic film 636 is disposed on the organic layer 635.

Figure 9:
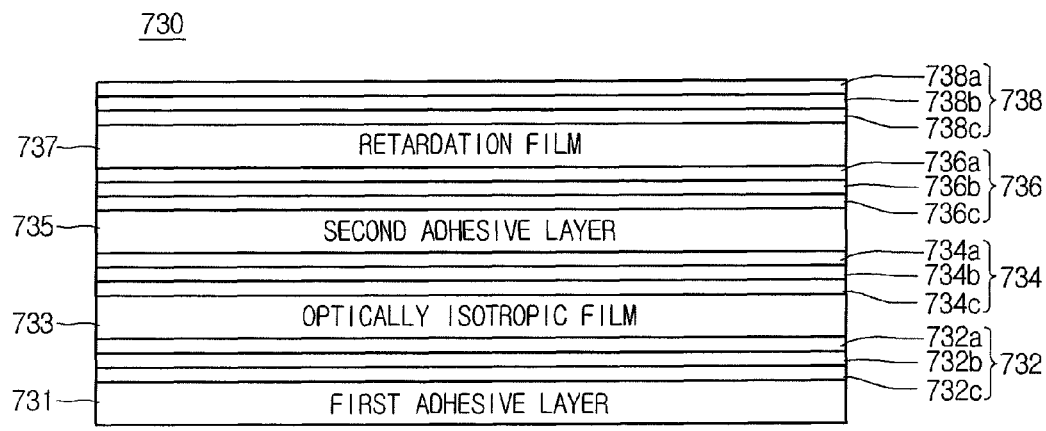

As shown in FIG. 9, a barrier film 730 according to a seventh embodiment of the present disclosure includes a first adhesive layer 731, a first thin layer 732, an optically isotropic film 733, a second thin layer 734, a second adhesive layer 735, a third thin layer 736, a retardation film 737 and a fourth thin layer 738 which are sequentially stacked.

Each of the first through fourth thin layers 732, 734, 736 and 738 can be configured with an organic film 732a, 734a, 736a and 738a, an inorganic film 732b, 734b, 736b and 738b, and another organic film 732c, 734c, 736c and 738c.

The fourth thin layer 738 can be used to primarily prevent the intrusion of external moisture and/or oxygen toward the organic light emitting element. The third thin layer 736 can be used to secondarily prevent the intrusion of external moisture and/or oxygen which have passed through the fourth thin layer 738. The second thin layer 734 can be used to thirdly prevent the intrusion of external moisture and/or oxygen which have passed through the third thin layer 736. The first thin layer 732 can be used to fourthly prevent the intrusion of external moisture and/or oxygen which have passed through the second thin layer 734.

Such a barrier film 730 according to a seventh embodiment of the present disclosure, which includes the first through fourth thin layers 732, 734, 736 and 738 each having a multi-layered structure of the organic and inorganic films, can encompass the organic light emitting element and prevent the intrusion of external moisture and/or oxygen into the organic light emitting element. Therefore, the organic light emitting element can be stably protected, and furthermore reliability of the organic light emitting element can be enhanced.

Figure 10:
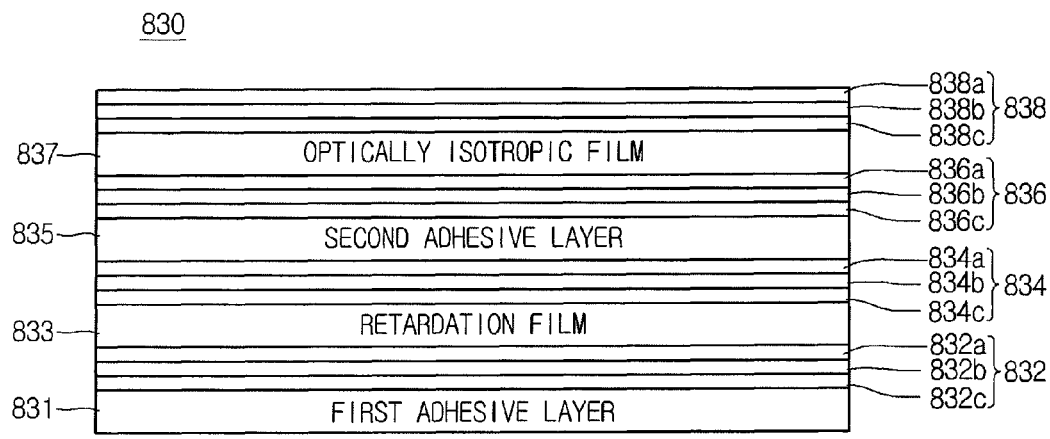

Referring to FIG. 10, a barrier film 830 according to a eighth embodiment of the present disclosure includes a first adhesive layer 831, a first thin layer 832, a retardation film 833, a second thin layer 834, a second adhesive layer 835, a third thin layer 836, an optically isotropic film 837 and a fourth thin layer 838 which are sequentially stacked.

The barrier film 830 of the eighth embodiment has the same structure as that of the seventh embodiment, except that the retardation film 832 is disposed on the first thin layer 832 and the optically isotropic film 837 is disposed on the third thin layer 736.

Figure 11:
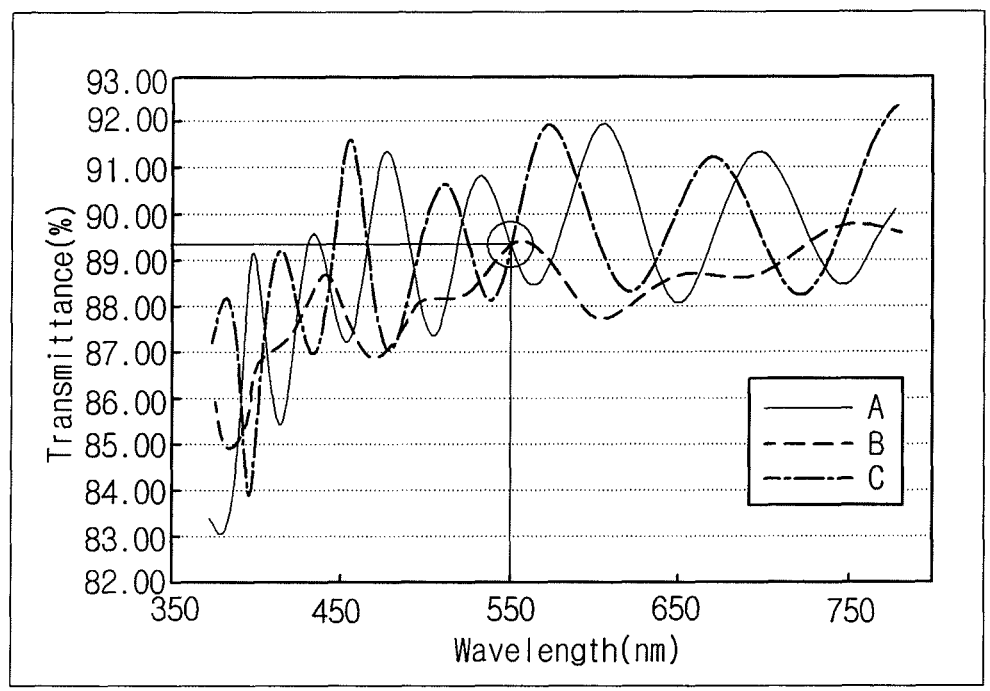
FIG. 11 is a graphic diagram illustrating transmittances of the barrier films shown in FIGS. 3 and 4 and the related art barrier film.

FIG. 11 is a graphic diagram illustrating transmittances of the barrier films shown in FIGS. 3 and 4 and the related art barrier film. In FIG. 11, a first curve line A illustrates the transmittance characteristic of a first OLED device with the related art barrier film, a second curve line B represents the transmittance characteristic of a second OLED device with the barrier film of FIG. 3, and a third curve line C illustrates the transmittance characteristic of a third OLED device with the barrier film of FIG. 4.

FIG. 11 will now be explained in detail referring to the following table 1.

TABLE 1

| Items | A | B | C |
|---|---|---|---|
| Black mode | OK | OK | OK |
| Transmittance (%) | 89.20 | 88.25 | 89.32 |
| Thickness (μm) | 100 | 100 | 100 |
| WVTR (g/m2-day) | ~5 × $10^{-3}$ | ~2 × $10^{-4}$~$10^{-5}$ | ~2 × $10^{-4}$~$10^{-5}$ |
| Cost ($) | 1.39 | 1.18 | 1.18 |

As seen from A through C in FIG. 11 and table 1, the first through third OLED devices have transmittances of 89.20%, 88.25% and 89.32%, respectively. Also, all the first through third OLED devices have the same thickness of 100 μm and realize a normally black mode.

Also, WVTRs (water vapor transmission rates) of the first through third OLED devices are measured using a WVTR tester. According to the measured resultants, the WVTRs of the second and third OLED devices with the retardation film and the optically isotropic film, which are coated with the thin layer having a multi-layered structure of organic and inorganic films, are measured to be ~2*$10^{-4}$~$10^{-5}$, but the WVRT of the first OLED device is measured to be ~5*$10^{-3}$.

As the measured WVTR becomes lower, the moisture quantity intruded into the OLED device becomes less. Therefore, it is evident that the second and third OLED devices with the retardation film and the optically isotropic film, which are coated with the thin layer having a multi-layered structure of organic and inorganic films, have a superior moisture/oxygen interception ratio compared to the first OLED device.

In other words, the second and third OLED devices each configured with the barrier films of the present embodiments, which each consist of the thin layers with a multi-layered structure of organic and inorganic films, have the similar properties to the related art OLED device. However, the second and third OLED devices can more effectively shield external moisture and/or oxygen compared to the related art OLED device and stably protect the organic light emitting element. Therefore, the OLED devices according to embodiments of the present disclosure can enhance reliability of the organic light emitting element.

It should be understood that numerous other modifications and embodiments can be devised by those skilled in the art that will fall within the spirit and scope of the principles of this disclosure. In other words, although embodiments have been described with reference to a number of illustrative embodiments thereof, this disclosure is not limited to those. Accordingly, the scope of the present disclosure shall be determined only by the appended claims and their equivalents. In addition, variations and modifications in the component parts and/or arrangements, alternative uses must be regarded as included in the appended claims.

What is claimed is:

1. An organic light emitting diode display comprising:
   a drive thin film transistor formed on a substrate;
   an organic light emitting diode configured with a first electrode, a light emission layer and a second electrode which are sequentially formed on the substrate provided with the drive thin film transistor;
   a barrier film disposed on the substrate with the organic light emitting element and configured to include a retardation film, an optically isotropic film and a thin layer interposed between the retardation film and the optically isotropic film; and
   a polarizing plate disposed on the barrier film and configured to prevent reflection of external light.

2. The organic light emitting diode display of claim 1, wherein the retardation film is disposed at one of a remote position from and a closed position to the organic light emitting element compared to the optically isotropic film.

3. The organic light emitting diode display of claim 1, wherein the thin layer includes first and second thin layers.

4. The organic light emitting diode display of claim 1, wherein the barrier film includes another thin layer interposed between the polarizing plate and it.

5. The organic light emitting diode display of claim 3, wherein the barrier film includes a first adhesive layer interposed between the first and second thin layers.

6. The organic light emitting diode display of claim 1, wherein the barrier film includes a second adhesive layer formed on a surface opposite to the polarizing plate.

7. The organic light emitting diode display of claim 1, wherein the polarizing plate is a linear polarizing plate.

8. The organic light emitting diode display of claim 3, wherein one of the first and second thin layers is formed in a single organic film.

9. The organic light emitting diode display of claim 7, wherein the polarizing plate includes:
   a polarizing layer configured to polarize incident light;
   first and second transparent supporter layers formed on both surfaces of the polarizing layer and configured to protect the polarizing layer;

a pressure sensitive adhesive layer attached to a lower surface of the transparent supporter layer; and a protective layer formed on an upper surface of the second transparent supporter layer and configured to protect the second transparent supporter layer.

10. The organic light emitting diode display of claim 1, wherein the thin layer includes first and second organic films formed from polymer materials including at least one selected from the group of acryl based resin, epoxy based resin, polyimide and polyethylene, and an inorganic film formed from at least one selected from the group of an aluminum oxide $AlO_y$, a silicon oxide $SiO_x$ and a silicon nitride $SiN_x$.

11. The organic light emitting diode display of claim 1, wherein the optically isotropic film is formed from one of a cyclic olefin copolymer based material, a cyclic olefin polymer based material, and a mixture of glass fiber and at least one of a cyclic olefin copolymer based material and a cyclic olefin polymer based material.

12. The organic light emitting diode display of claim 11, wherein the optically isotropic film has a retardation value of 0~5 nm.

13. The organic light emitting diode display of claim 1, wherein the retardation film is formed from a polycarbonate based material and has a retardation range of 138 nm~148 nm.

14. A method of manufacturing an organic light emitting diode display, the method comprising:

forming a drive thin film transistor on a substrate;

forming an organic light emitting diode configured a first electrode, a light emission layer and a second electrode which are sequentially formed on the substrate provided with the drive thin film transistor;

attaching a barrier film, which includes a retardation film, an optically isotropic film and a thin layer interposed between the retardation film and the optically isotropic film, to the substrate provided with the organic light emitting element; and attaching a polarizing plate, which is configured to prevent reflection of external light, on the barrier film.

15. The method of claim 14, wherein the retardation film is disposed at one of a remote position from and a closed position to the organic light emitting element compared to the optically isotropic film.

16. The method of claim 14, wherein the thin layer includes first and second thin layers.

17. The method of claim 16, wherein the barrier film includes a first adhesive layer interposed between the first and second thin layers.

18. The method of claim 14, wherein the thin layer includes first and second organic films, formed from polymer materials including at least one selected from the group of acryl based resin, epoxy based resin, polyimide and polyethylene, and an inorganic film formed from at least one selected from the group of an aluminum oxide $AlO_y$, a silicon oxide $SiO_x$ and a silicon nitride $SiN_x$.

* * * * *